United States Patent
Kawamura et al.

(10) Patent No.: US 8,945,412 B2
(45) Date of Patent: Feb. 3, 2015

(54) SUBSTRATE CLEANING APPARATUS, SUBSTRATE CLEANING METHOD, AND SUBSTRATE PROCESSING APPARATUS

(75) Inventors: Shigeru Kawamura, Nirasaki (JP); Teruyuki Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 212 days.

(21) Appl. No.: 13/558,876

(22) Filed: Jul. 26, 2012

(65) Prior Publication Data
US 2012/0298132 A1    Nov. 29, 2012

Related U.S. Application Data

(62) Division of application No. 12/297,746, filed as application No. PCT/JP2007/057527 on Apr. 4, 2007, now abandoned.

(30) Foreign Application Priority Data

Apr. 20, 2006  (JP) ................................ 2006-116327
Mar. 22, 2007  (JP) ................................ 2007-074326

(51) Int. Cl.
*B08B 7/04*    (2006.01)
*B08B 5/04*    (2006.01)
*H01L 21/02*   (2006.01)
*H01L 21/67*   (2006.01)

(52) U.S. Cl.
CPC .... *H01L 21/02087* (2013.01); *H01L 21/67115* (2013.01); *Y10S 134/902* (2013.01)
USPC ............ 216/66; 134/1.2; 134/902; 156/345.5

(58) Field of Classification Search
USPC ..................................................... 134/1.1, 1.2
See application file for complete search history.

(56) References Cited

U.S. PATENT DOCUMENTS

| | | |
|---|---|---|
| 5,246,526 A | 9/1993 | Yamaguchi et al. |
| 5,982,474 A | 11/1999 | Akiyama et al. |
| 6,264,748 B1 | 7/2001 | Kuriki et al. |
| 6,432,620 B1 | 8/2002 | Arao |

(Continued)

FOREIGN PATENT DOCUMENTS

| | | |
|---|---|---|
| JP | 01-204426 | 8/1989 |
| JP | 03-032022 | 2/1991 |

(Continued)

OTHER PUBLICATIONS

Nogami et al., WO 2006/006526; Jan. 19, 2006 (Machine Translation).

*Primary Examiner* — Parviz Hassanzadeh
*Assistant Examiner* — Nathan K Ford
(74) *Attorney, Agent, or Firm* — Oblon, Spivak, McClelland, Maier & Neustadt, L.L.P.

(57) ABSTRACT

A substrate cleaning apparatus is capable of cleaning an entire periphery of a substrate end portion at a time by simple control without polishing the end portion and without generating plasma. The substrate cleaning apparatus has a mounting table 204 on which a wafer W is placed, a heating unit 210 for heating a wafer end portion, ultraviolet application unit 220 for applying ultraviolet to the wafer end portion, and a gas flow forming unit 230 for forming a gas flow on the surface of the wafer end portion. The heating unit, the ultraviolet application unit, and the gas flow forming unit are disposed near the wafer end portion so as to surround the wafer.

4 Claims, 9 Drawing Sheets

(56) References Cited

U.S. PATENT DOCUMENTS

| | | |
|---|---|---|
| 2003/0146200 A1 | 8/2003 | Takahashi et al. |
| 2005/0077628 A1* | 4/2005 | Kumar et al. ............... 257/758 |
| 2005/0116345 A1* | 6/2005 | Murtuza ...................... 257/758 |
| 2005/0260771 A1* | 11/2005 | Iwashita et al. ................ 438/1 |
| 2005/0284576 A1 | 12/2005 | America et al. |
| 2006/0130750 A1* | 6/2006 | Ishikawa et al. ............. 118/300 |
| 2006/0130950 A1 | 6/2006 | Murata |
| 2008/0017613 A1 | 1/2008 | Nogami et al. |
| 2008/0073324 A1 | 3/2008 | Nogami et al. |

FOREIGN PATENT DOCUMENTS

| | | |
|---|---|---|
| JP | 05-102101 | 4/1993 |
| JP | 10-242098 | 9/1998 |
| JP | 2003-035962 | 2/2003 |
| JP | 2003-218007 | 7/2003 |
| JP | 2003-234303 | 8/2003 |
| JP | 2004-096086 | 3/2004 |
| JP | 2006-049870 | 2/2006 |

\* cited by examiner

SUBSTRATE CLEANING APPARATUS, SUBSTRATE CLEANING METHOD, AND SUBSTRATE PROCESSING APPARATUS

CROSS REFERENCE TO RELATED APPLICATION

The present application is a divisional of U.S. application Ser. No. 12/297,746, filed on Oct. 20, 2008, now abandoned, which was the National Stage of International Application No. PCT/JP2007/057527, filed on Apr. 4, 2007, which claimed priority to Japanese Application No. 2007-074326, filed on Mar. 22, 2007 and Japanese Application No. 2006-116327, filed on Apr. 20, 2006. The entire contents of application Ser. No. 12/297,746 is hereby incorporated by reference in its entirety.

FIELD OF THE INVENTION

The present invention relates to a substrate cleaning apparatus for cleaning an end portion of a substrate, e.g., a semiconductor wafer or a liquid crystal substrate, a substrate cleaning method and a substrate processing apparatus.

BACKGROUND OF THE INVENTION

Recently, a surface state of an end portion of a substrate, e.g., a semiconductor wafer (hereinafter, simply referred to as "wafer"), is considered to be important in view of improving a production yield in the manufacture of semiconductor devices. While performing an etching process, a film forming process or the like on the wafer, undesired deposits may be adhered to the end portion of the wafer.

For example, when a plasma etching process is performed on a wafer surface by using a plasma of a fluorocarbon-based (CF-based) gas used as a processing gas, by-products (deposits) of fluorocarbon-based (CF-based) polymer are generated by competing reaction (polymerization reaction) to thereby be adhered not only to a device surface on the wafer but also to the end portion of the wafer (e.g., a rear side of the end portion which includes a beveled portion).

Further, when a CF-based film is formed on the wafer surface by employing a CVD (chemical vapor deposition) method by using a CF-based gas, the CF-based film extends from the wafer surface to the end portion. Moreover, it may extend further to the rear side of the end portion.

Patent Document 1: Japanese Patent Laid-open Application No. H5-102101
Patent Document 2: Japanese Patent Laid-open Application No. H10-242098

The deposits adhered to the end portion of the wafer are peeled off when the wafer is supported at the end portion thereof or is transferred, and then are adhered to the wafer surface, thereby decreasing a production yield of semiconductor devices to be manufactured. Therefore, the deposits adhered to the end portion of the wafer need to be removed by cleaning.

Conventionally, the deposits are used to be removed by polishing the end portion of the wafer by a brush or a tape. However, in the case of polishing the end portion of the wafer, it is troublesome to remove dust generated by the polishing and, also, contamination may be caused by the dust. Accordingly, the deposits adhered to the end portion of the wafer need to be removed without the polishing process.

Patent Document 1 discloses therein a method for removing fluorocarbon-based polymer on a wafer by applying ultraviolet to the wafer and simultaneously generating a plasma of nitrogen monoxide. In this method, however, a film (e.g., a low-k film) formed on the wafer may be damaged by the plasma thus generated, depending on the type of the film. Therefore, the deposits adhered to the end portion of the wafer need to be removed without inflicting damages on the wafer surface.

Moreover, Patent Document 2 discloses therein an apparatus including a supporting unit for rotatably supporting a wafer and an ultraviolet generation unit for applying ultraviolet to a part of a periphery of the wafer to thereby remove foreign substances adhered to the part of the periphery of the wafer (uneven part used for supporting the wafer). However, with this apparatus, the ultraviolet is applied only to a part of the periphery of the wafer. Therefore, in order to clean the entire periphery of the end portion of the wafer, the cleaning needs to be performed while the wafer being slightly rotated. As a consequence, a long period of time is required to remove the deposits. Furthermore, a rotation shaft of the supporting unit needs to coincide with a central portion of the wafer, or a position of the ultraviolet generation unit needs to be adjusted. As a result, required control processes increase.

SUMMARY OF THE INVENTION

In view of the above, the present invention provides a substrate cleaning apparatus or the like capable of cleaning an entire periphery of an end portion of a substrate at a time by a simple control without polishing the end portion and without generating a plasma.

In accordance with one aspect of the present invention, there is provided a substrate cleaning apparatus for removing deposits adhered to an end portion of a substrate, the substrate cleaning apparatus including: a mounting table on which the substrate is placed; a heating unit for heating the end portion of the substrate; an ultraviolet application unit for applying ultraviolet to the end portion of the substrate; and a gas flow forming unit for forming a gas flow on a surface of the end portion of the substrate, wherein the heating unit, the ultraviolet application unit and the gas flow forming unit are disposed near the end portion of the substrate so as to surround the substrate.

In accordance with the present invention, the entire periphery of the end portion of the substrate is heated at a time by the heating unit and, at the same time, the ultraviolet is applied at a time to the entire periphery of the end portion of the substrate by the ultraviolet application unit. Accordingly, the gas flow can be formed by the gas flow forming unit on the surface of the end portion of the substrate along the entire periphery of the end portion of the substrate. Therefore, the undesired deposits adhered to the end portion of the substrate can be removed at a time by a simple control and, hence, the end portion of the substrate can be cleaned in a short period of time.

By applying the ultraviolet to the end portion of the substrate, the deposits adhered to the end portion of the substrate can be removed by vaporization caused by chemical decomposition reaction. Therefore, the end portion of the substrate need not be polished and, further, there arises no need to remove dust generated by polishing. In addition, no plasma is generated, so that a film (e.g., a low-k film) formed on the substrate is not damaged.

Further, the ultraviolet application unit has an ultraviolet lamp arranged in an annular shape near the end portion of the substrate so as to surround an entire periphery thereof. The UV lamp may be a single UV lamp formed in an annular shape, or may include a plurality of UV lamps arranged in an annular shape. By using the UV lamp, the ultraviolet can be applied at a time to the entire periphery of the end portion of the substrate.

Furthermore, the heating unit includes: a heating lamp arranged in an annular shape near the end portion of the substrate so as to surround an entire periphery thereof; and an annular covering member, opened at a side facing the substrate, for covering the heating lamp; wherein the covering member has an inner surface made of a member reflecting light of the heating lamp, and is constructed to allow the reflected light to be concentrated to the end portion of the substrate.

With this configuration, the end portion of the substrate can be heated at a time by applying the ultraviolet to the entire periphery of the end portion of the substrate, thereby reducing the heating time. Further, the heating lamp is a halogen lamp, thereby locally heating more effectively by radiant heat of far infrared ray.

Further, the gas flow forming unit includes a discharge pipe provided at an inner side of the end portion of the substrate so as to be disposed in an annular shape around an entire periphery of the end portion of the substrate and a suction pipe provided at an outer side of the end portion of the substrate so as to be arranged in an annular shape around the entire periphery of the end portion of the substrate.

In this case, the discharge pipe and the suction pipe are respectively formed as annular pipes, the discharge pipe having around a periphery thereof a discharge opening for discharging a gas, and the suction pipe having around a periphery thereof a suction opening for sucking in a gas. For example, the discharge opening and the suction opening are respectively formed as slits provided around the peripheries of the pipes and a plurality of openings formed around the peripheries of the pipes.

Further, the suction pipe has a concentration sensor for detecting a concentration of a reaction product gas generated by chemical reaction of the deposits adhered to the end portion of the substrate. The concentration sensor detects a concentration of carbon dioxide generated by removing the fluorocarbon-based polymer adhered to the end portion of the substrate.

By detecting the concentration of the reaction product gas (e.g., carbon dioxide) with the use of the concentration sensor, an end point of the cleaning process of the substrate end portion can be detected.

Furthermore, the heating unit includes a heater arranged in an annular shape at a rear side of the entire periphery of the end portion of the substrate, so that the entire periphery of the end portion of the substrate may be heated by the heater. Accordingly, the entire periphery of the end portion of the substrate can be heated at a time. In this case, a shielding plate is provided to surround the periphery of the end portion of the substrate. The shielding plate blocks ultraviolet from the ultraviolet application unit and, thus, the ultraviolet can be prevented from reaching the surface of the substrate. Further, the shielding plate prevents a gas flow formed by the gas flow forming unit from flowing through the surface of the substrate. As a result, a gas flow can be efficiently formed on the end portion of the substrate.

In accordance with another aspect of the present invention, there is provided a substrate cleaning method of a substrate cleaning apparatus for removing deposits adhered to an end portion of a substrate, the substrate cleaning apparatus including: a heating unit for heating the end portion of the substrate placed on a mounting table; an ultraviolet application unit for applying ultraviolet to the end portion of the substrate; and a gas flow forming unit for forming a gas flow on a surface of the end portion of the substrate, all being disposed near the end portion of the substrate so as to surround the substrate, wherein when the end portion of the substrate needs to be cleaned by the substrate cleaning apparatus, the end portion of the substrate is heated by the heating unit and, then, the ultraviolet is applied to the end portion of the substrate by the ultraviolet application unit while a gas flow is formed on the surface of the end portion of the substrate by the gas flow forming unit.

In accordance with the present invention, the entire periphery of the end portion of the substrate can be cleaned at a time by a simple control, so that the end portion of the substrate can be cleaned in a short period of time. Moreover, the gas flow is formed on the surface of the end portion of the substrate by applying ultraviolet thereto after the end portion of the substrate is heated. Since the end portion of the substrate is heated to a certain temperature before the UV application, the efficiency of the chemical decomposition reaction for removing deposits can be improved.

Further, the gas flow forming unit includes a discharge pipe provided at an inner side of the end portion of the substrate; and a suction pipe provided at an outer side of the end portion of the substrate, wherein when a gas flow needs to be formed on the surface of the end portion of the substrate, a gas is discharged from the discharge pipe toward the end portion of the substrate, and then is sucked into the suction pipe. In this case, the suction pipe has a concentration sensor for detecting a concentration of carbon dioxide generated by removing fluorocarbon-based polymer adhered to the end portion of the substrate, wherein the concentration of the carbon dioxide sucked in into the suction pipe is detected by the concentration sensor during cleaning of the end portion of the substrate, and the cleaning of the end portion of the substrate is completed when the concentration of the carbon dioxide becomes smaller than or equal to a predefined threshold value. Accordingly, the end point of the cleaning process can be detected with high precision. As a result, the efficiency of the cleaning process is improved, and the deposits can be reliably removed in a shorter period of time.

In accordance with still another aspect of the present invention, there is provided a substrate processing apparatus including: a processing unit including a plurality of processing chambers, each for processing a substrate in a vacuum pressure environment; a transfer unit, connected to the processing unit, including a transfer chamber for transfering the substrate in the atmospheric environment to and from a substrate accommodating vessel for accommodating the substrate; and a cleaning chamber, connected to the transfer chamber, for removing deposits adhered to an end portion of the substrate in the atmospheric environment, wherein the cleaning chamber has a heating unit for heating the end portion of the substrate placed on a mounting table; an ultraviolet application unit for applying ultraviolet to the end portion of the substrate; and a gas flow forming unit for forming a gas flow on a surface of the end portion of the substrate, all being disposed near the end portion of the substrate so as to surround the substrate. In this case, it is preferable that the ultraviolet application unit has a low-pressure mercury lamp disposed in an annular shape near the end portion of the substrate so as to surround an entire periphery thereof.

In accordance with still another aspect of the present invention, there is provided A substrate processing apparatus including: a processing unit including a plurality of processing chambers, each for processing a substrate in the vacuum pressure environment; and a transfer unit, connected to the processing unit, including a transfer chamber for transfering the substrate in the atmospheric environment to and from a substrate accommodating vessel for accommodating the substrate, wherein one of the plurality of processing chambers is used as a cleaning chamber for removing deposits adhered to an end portion of the substrate in a vacuum environment, wherein the cleaning chamber has a heating unit for heating the end portion of the substrate placed on a mounting table; an ultraviolet application unit for applying ultraviolet to the end portion of the substrate; and a gas flow forming unit for forming a gas flow on a surface of the end portion of the substrate, all being disposed near the end portion of the substrate so as to surround the substrate. In this case, it is preferable that the ultraviolet application unit has an excimer lamp arranged in an annular shape near the end portion of the substrate so as to surround an entire periphery thereof.

Effects of the Invention

In accordance with the present invention, there can be provided a substrate cleaning apparatus or the like capable of cleaning an entire periphery of an end portion of a substrate at a time with a simple control by removing deposits adhered to the end portion of a substrate through chemical decomposition reaction.

DESCRIPTION OF REFERENCE NUMERALS

Figure 1:
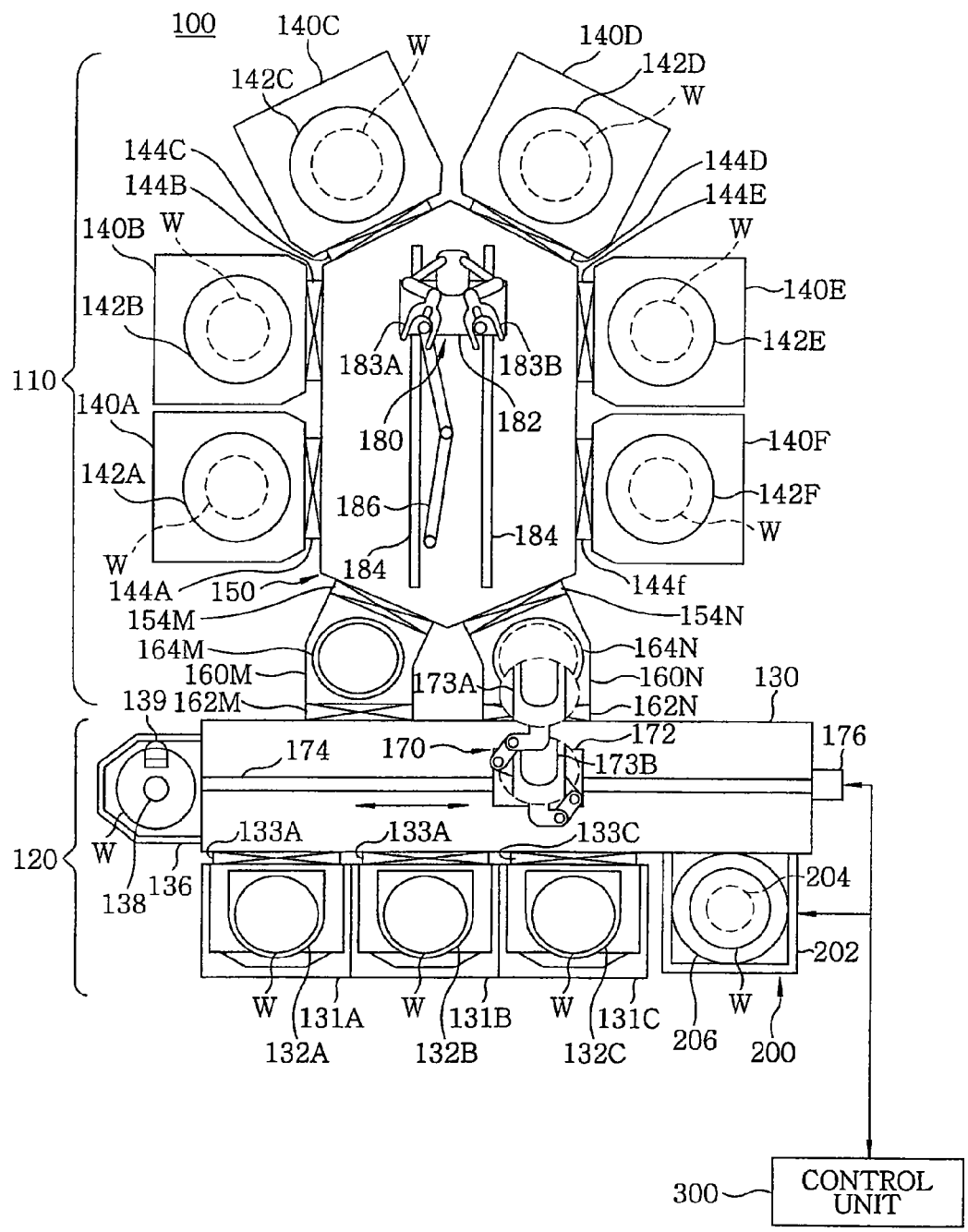
FIG. 1 shows a cross sectional view of a configuration example of a substrate processing apparatus in accordance with a first embodiment of the present invention.

100: substrate processing apparatus
110: processing unit
120: transfer unit
130: transfer chamber
131(131A-131C): cassette table
132(132A-132C): cassette container
133(133A-133C): gate valve
136: orientor
138: rotation table
139: optical sensor
140(140A-140F): processing chamber
142(142A-142F): mounting table
144(144A-144F): gate valve
146: focus ring
150: common transfer chamber
154(154M, 154N): gate valve
160(160M, 160N): load lock chamber
162(162M, 162N): gate valve
164(164M, 164N): transfering table
170: transfer unit-side transfer mechanism
172: base
173(173A, 173B): pick
174: guide rail
176: linear motor driving mechanism
180: processing unit-side transfer mechanism
182: base
183 (183A, 183B): pick
184: guide rail
186: flexible arm
200: cleaning chamber
202: vessel
204: mounting table
206: cleaning mechanism
210: heating unit
212: heating lamp
214: covering member
220: ultraviolet application unit
222: UV lamp
230: gas flow forming unit
232: discharge pipe
233: discharge opening
234: suction pipe
235: suction opening
236: concentration sensor
240: shielding plate
250: heater
300: control unit
W: wafer

DETAILED DESCRIPTION OF THE EMBODIMENT

The embodiments of the present invention will be described with reference to the accompanying drawings. In the following description, like parts or components having (Configuration Example of Substrate Processing Apparatus)

First of all, a substrate processing apparatus in accordance with a first embodiment of the present invention will be described with reference to the drawings. FIG. 1 is a cross sectional view showing a schematic configuration of the substrate processing apparatus in accordance with the first embodiment of the present invention. This substrate processing apparatus 100 includes: a processing unit 110 having a plurality of processing chambers for performing in the vacuum pressure environment various processes such as a film forming process, an etching process and the like on a substrate, e.g., a semiconductor wafer (hereinafter, simply referred to as "wafer") W; and a transfer unit 120 for loading/unloading the wafer W to and from the processing unit 110.

The transfer unit 120 is constructed as shown in, e.g., FIG. 1. The transfer unit 120 has a transfer chamber 130 for loading/unloading a wafer to transfer it between the processing unit 110 and substrate accommodating containers, e.g., cassette containers 132 (132A to 132C) to be described later. Further, the transfer chamber 130 has a substantially polygonal cross section. On one of long sides of the transfer chamber 130 having a substantially polygonal cross section, a plurality of cassette tables 131 (131A to 131C) are arranged side by side. Each of the cassette tables 131A to 131C is configured to place thereon a corresponding one of the cassette containers 132A to 132C serving as the substrate accommodating containers.

Each of the cassette containers 132 (132A to 132C) can accommodate therein a plurality of wafers W, e.g., 25 wafers W at most, with regular pitches therebetween at multiple levels, wherein end portions of the wafers W are supported by supporting units. The inside of each cassette container 132 is formed of an airtight structure filled with, e.g., the $N_2$ gas atmosphere. The wafers W are loaded to and unloaded from the transfer chamber 130 via gate valves 133 (133A to 133C). Further, the number of the cassette tables 131 and the number of cassette containers 132 are not limited to those shown in FIG. 1.

Moreover, a cleaning chamber 200 as an example of a substrate cleaning apparatus is connected to a lateral side of the transfer chamber 130. In the cleaning chamber 200, a cleaning process is performed on a wafer W that has been subjected to a predetermined process such as etching, film forming or the like, to thereby remove undesired deposits adhered to an end portion (e.g., a beveled portion) of the wafer W. A configuration of the cleaning chamber 200 will be described in detail later.

On an end portion of the transfer chamber 130, i.e., on one of short sides of the transfer chamber 130 having the substantially polygonal cross section, an orientor (pre-alignment stage) 136 having therein a rotation table 138 and an optical sensor 139 for optically detecting a periphery of the wafer W is provided as a positioning device. The orientor 136 performs alignment by detecting, e.g., orientation flats or notches of the wafer W.

The transfer chamber 130 has therein a transfer unit-side transfer mechanism (a transfer mechanism inside the transfer chamber) 170 for transferring the wafer W in a lengthwise direction thereof (indicated by the arrow in FIG. 1). A base 172 to which the transfer unit-side transfer mechanism 170 is fixed is slidably supported on a guide rail 174 extending in the lengthwise direction of the transfer chamber 130 at the center thereof. The base 172 and guide rail 174 are respectively provided with a movable member and a stationary member of a linear motor. A linear motor driving mechanism 176 for driving the linear motor is provided at an end portion of the guide rail 174. A control unit 300 is connected to the linear motor driving mechanism 176. Accordingly, the linear motor driving mechanism 176 is driven based on a control signal from the control unit 300, thereby moving the transfer unit-side transfer mechanism 170 and the base 172 along the guide rail 174 in the arrow direction.

The transfer unit-side transfer mechanism 170 is configured as a double arm mechanism having two picks 173A and 173B, so that two wafers W can be handled at a time. Accordingly, when the wafers W are loaded to and unloaded from, e.g., the cassette containers 132, the orientor 136 and load lock chambers 160M and 160N, the wafer exchange can be performed. Further, the number of picks of the transfer unit-side transfer mechanism 170 is not limited to those in the above example. For example, the transfer unit-side transfer mechanism 170 can be a single arm mechanism having a single pick.

Hereinafter, a configuration example of the processing unit 110 will be explained. For example, in case of a cluster tool type substrate processing apparatus, the processing unit 110 has a common transfer chamber 150 of a polygonal shape (e.g., hexagonal shape) as shown in FIG. 1. The load lock chambers 160M and 160N and a plurality of processing chambers 140 (a first to a sixth processing chamber 140A to 140F) are airtightly connected to the common transfer chamber 150 around a periphery of the common transfer chamber 150. The processing chambers 140 perform predetermined processes, such as film forming (e.g., plasma CVD), etching (e.g., plasma etching) or the like.

The processing chambers 140A to 140F are configured to perform the same process or different processes on the wafers W according to process recipe, or the like recorded in advance in a storage medium of the control unit 300 or the like. The processing chambers 140 (140A to 140F) are respectively provided with mounting tables 142 (142A to 142F) for mounting thereon the wafers W. Moreover, the number of the processing chambers 140 is not limited to that shown in FIG. 1.

The common transfer chamber 150 has a function of transferring wafers W among the processing chambers 140A to 140F or between the processing chambers 140A to 140F and the first and the second load lock chambers 160M and 160N. The processing chambers 140 (140A to 140F) are connected to the common transfer chamber 150 having a polygonal shape (e.g., hexagonal shape) through respective gate valves 144 (144A to 144E). Further, leading ends of the first and second load lock chambers 160M and 160N are connected to the common transfer chamber 150 through respective gate valves (vacuum side gate valves) 154M and 154N. Bases of the first and the second load lock chamber 160M and 160N are connected to the other of long sides of the transfer chamber 130 having the substantially polygonal cross section, through respective gate valves (atmospheric side gate valves) 162M and 162N.

Each of the first and the second load lock chamber 160M and 160N has a function of temporarily holding a wafer W and adjusting the pressure therein before delivery of the wafer W. The first and the second load lock chamber 160M and 160N are respectively provided with transferring tables 164M and 164N for mounting thereon the wafer W.

As described above, in the processing unit 110 of the cluster tool type, the portion between the common transfer chamber 150 and each of the processing chambers 140A to 140F, and the portion between the common transfer chamber 150 and each of the load lock chambers 160M and 160N can be opened and closed airtightly. When necessary, the common transfer chamber 150 can communicate with the processing chambers 140A to 140F and the load lock chambers 160M and 160N. In addition, the portion between the first and second load lock chamber 160M and 160N and the transfer chamber 130 can be opened and closed airtightly.

The common transfer chamber 150 is provided with a processing unit-side transfer apparatus (transfer mechanism inside common transfer chamber) 180 formed as, e.g., a multi-joint arm capable of shortening and lengthening, elevating, and pivoting. The processing unit-side transfer mechanism 180 is rotatably supported at a base 182. The base 182 is driven by, e.g., a slide driving motor (not shown), to slide along a guide rail 184 extending from the proximal end side to the distal end side of the common transfer chamber 150. Further, the base 182 is connected with a flexible arm 186 for passing therethrough, e.g., wiring of an arm rotating motor or the like. In the above-configured processing unit-side transfer mechanism 180, the access to each of load lock chamber 160M and 160N and each of processing chambers 140A to 140F can be obtained by sliding the processing unit-side transfer mechanism 180 along the guide rail 184.

For instance, when the processing unit-side transfer mechanism 180 is made to have access to each of the load lock chambers 160M and 160N and the processing chambers 140A and 140F facing each other, the processing unit-side transfer mechanism 180 is positioned at the proximal end side of the common transfer chamber 150 along the guide rail 184. Meanwhile, when the processing unit-side transfer mechanism 180 is made to have access to the four processing chambers 140B to 140E, the processing unit-side transfer mechanism 180 is positioned at the distal end side of the common transfer chamber 150 along the guide rail 184. Accordingly, the access to the load lock chambers 160M and 160N and the processing chambers 140A to 140F, all being connected to the common transfer chamber 150, can be obtained by the single processing unit-side transfer mechanism 180. The processing unit-side transfer mechanism 180 has two picks 183A and 183B, so that two wafers W can be handled at a time.

The processing unit-side transfer mechanism 180 may be configured as two transfer mechanisms without being limited to the above configuration. For example, a first transfer mechanism formed as a multi-joint arm capable of shortening and lengthening, elevating and pivoting can be provided at the proximal end side of the common transfer chamber 150, and a second transfer mechanism formed as a multi-joint arm capable of shortening and lengthening, elevating and pivoting can be provided at the distal end side of the common transfer chamber 150. Further, the processing unit-side transfer mechanism 180 does not necessarily have two picks. For instance, it may have only a single pick.

The substrate processing apparatus 100 includes the control unit 300 for controlling the transfer unit-side transfer mechanism 170, the processing unit-side transfer mechanism 180, the gate valves 133, 144, 154 and 162, the orientor 136, the cleaning chamber 200 and the like. The control unit 300 also controls the entire operation of the substrate processing apparatus. The control unit 300 has a CPU (central processing unit) forming a main body thereof, a storage medium such as a memory, a hard disk or the like for recording programs, recipes or the like.

(Operation of Substrate Processing Apparatus)

Hereinafter, an operation of the above-configured substrate processing apparatus will be explained. The substrate processing apparatus 100 is operated by the control unit 300 based on a specific program. For example, a wafer W unloaded from one of the cassette containers 132A to 132C by the transfer unit-side transfer mechanism 170 is transferred to the orientor 136, and then is mounted on a rotation table 138 of the orientor 136 so as to be oriented. The oriented wafer W is unloaded from the orientor 136, and then is loaded into the load lock chamber 160M or 160N. At this time, if a processed wafer W that has undergone all necessary processes is positioned in the load lock chamber 160M or 160N, the processed wafer W is unloaded therefrom and, then, the unprocessed wafer W is loaded thereinto.

The wafer W loaded into the load lock chamber 160M or 160N is unloaded from the load lock chamber 160M or 160N by the processing unit-side transfer mechanism 180. Next, the wafer W is loaded into the processing chamber 140, and a predetermined process is performed thereon. Thereafter, the processed wafer W that has undergone the predetermined process in the processing chamber 140 is unloaded from the processing chamber 140 by the processing unit-side transfer mechanism 180. In this case, if the wafer W is consecutively processed in the plurality of processing chambers 140, the wafer W is loaded into another processing chamber 140 for performing a next process, and then is mounted on the mounting table 142 forming a lower electrode.

Then, a predetermined processing gas is introduced through a showerhead forming an upper electrode facing the lower electrode and, then, the processing gas is converted into a plasma by specific high frequency electric power applied to the respective electrodes. Thereafter, a predetermined process such as etching, film forming or the like is performed on the wafer W by the plasma thus generated.

Figure 2:
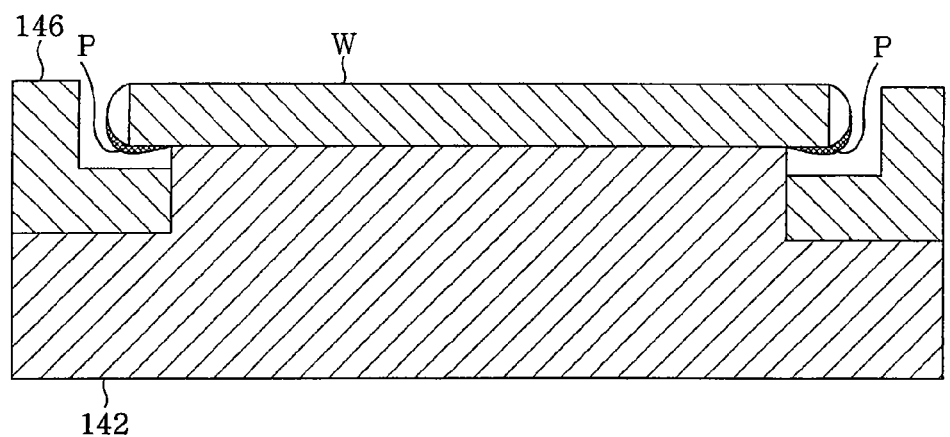
FIG. 2 describes an explanatory diagram for explaining a process in which deposits such as CF-based polymer or the like are adhered to an end portion of a wafer.

By performing the plasma processing on the wafer W, undesired deposits P may be adhered to an end portion of the wafer W, as depicted in FIG. 2. As can be seen from FIG. 2, generally, a diameter of an upper portion of the mounting table 142 is slightly smaller than that of the wafer W. Therefore, when the wafer W is mounted on the mounting table 142, the end portion of the wafer W is projected from the mounting table 142 along the entire periphery thereof. Moreover, a ring-shaped focus ring 146 is disposed on the mounting table 142 to surround the periphery of the wafer W, to thereby reduce discontinuity of a bias potential in the surface of the wafer W.

Meanwhile, an inner peripheral surface of the focus ring 146 has a diameter slightly larger than that of the wafer W so as not to contact with the wafer W. Accordingly, a small gap is left between a peripheral edge of the wafer W and the inner peripheral surface of the focus ring 146. Therefore, when a predetermined plasma processing such as etching, film forming or the like is performed on the wafer W, the plasma of the processing gas will fill the gap between the wafer W and the focus ring 146. As a result, undesired deposits may be adhered to a rear side (e.g., beveled portion) of the end portion of the wafer W. When the focus ring 146 is not provided, undesired deposits may also be adhered to the end portion of the wafer W.

Figure 3:
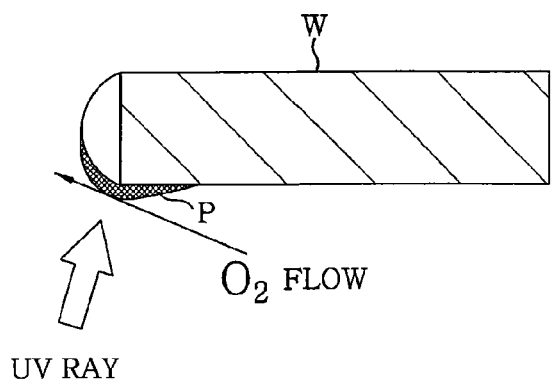
FIG. 3 provides an enlarged cross sectional view of the end portion of the wafer in case of performing an etching process on a surface of the wafer by using a CF-based gas.

FIG. 3 provides an enlarged cross sectional view of the end portion of the wafer W in case of performing an etching process on the wafer surface by using as a processing gas, e.g., a fluorocarbon-based (CF-based) gas. As illustrated in FIG. 3, when the plasma etching process is performed, by-products (deposits) made of fluorocarbon-based polymer (CF-based polymer) are generated by competing reaction (polymerization reaction), and then are adhered to the end portion of the wafer W (e.g., a rear side of the end portion which includes a beveled portion).

Figure 4:
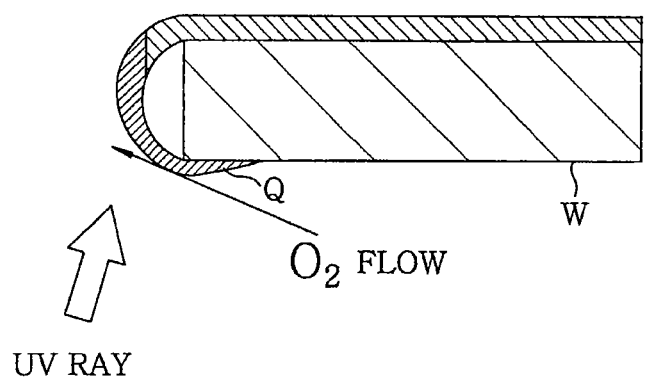
FIG. 4 presents an enlarged cross sectional view of the end portion of the wafer in case of performing on the surface of the wafer a film forming process for forming a CF-based film by employing a CVD method by using a CF-based gas.

FIG. 4 presents an enlarged cross sectional view of the end portion of the wafer W in case of performing on the wafer surface a film forming process for forming a CF-based film by a CVD method by using a CF-based gas as a processing gas. As described in FIG. 4, the CF-based film formed by the CVD method extends from the surface of the wafer W to the periphery of the end portion, and may extend further to the rear side thereof (e.g., the rear side of the end portion which includes the beveled portion). In the CF-based film, a CF-based film Q formed at the end portion of the wafer W is unnecessary, and hence is considered as undesired deposits as same as the by-products generated by the plasma etching process.

The deposits (e.g., the CF-based polymer P or the CF-based film Q) adhered to the end portion of the wafer W (e.g., the rear side of the end portion which includes the beveled portion) by the etching or the film forming are considered as one of the causes for affecting a yield of semiconductor devices to be formed on a wafer W. For example, when the wafer W is returned to one of the cassette containers 132A to 132C, the end portion of the wafer W contacts with a support portion inside a cassette container, so that the deposits adhered to the end portion of the wafer are peeled off and adhered to the wafer surface. As a consequence, the production yield of the semiconductor devices to be formed may decrease. Therefore, the deposits adhered to the wafer end portion need to be removed.

Accordingly, in the substrate processing apparatus 100 in accordance with this embodiment, the wafers W that have undergone processes in the respective processing chambers 140 are transferred to the cleaning chamber 200 via the load lock chamber 160M or 160N. The end portions of the wafers W are cleaned in the cleaning chamber 200 and, then, the wafers W are returned to the original cassette containers 132A to 132C. Since the deposits adhered to the end portions of the wafers W are removed by the cleaning process, it is possible to prevent the deposits adhered to the end portions of the wafers W from being peeled off when the wafers W are returned to the cassette containers 132A to 132C.

Hereinafter, the cleaning process in the cleaning chamber 200 will be described with reference to FIG. 3. When the CF-based polymer P is adhered as deposits to the end portion of the wafer W, the end portion of the wafer W is heated to, e.g., a predetermined temperature (e.g., about 200° C.). Further, ultraviolet is applied to the CF-based polymer P and, at the same time, a flow of a gas containing, e.g., oxygen $O_2$, is formed near a surface of the CF-based polymer P. By applying ultraviolet (hv) to the CF-based polymer P, $O_2$ near the CF-based polymer P is excited. As a result, active oxygen O is generated by chemical reaction to be described in following chemical reaction Eqs. (1):

$$O_2 + h\nu \rightarrow O + O$$

$$O + O_2 \rightarrow O_3$$

$$O_3 + h\nu \rightarrow O_2 + O \qquad \text{Eqs. (1)}$$

The active oxygen O thus generated undergoes decomposition reaction with carbon C of the CF-based polymer P, thereby generating carbon dioxide $CO_2$ and fluorine F, as shown in a following chemical reaction Eq. (2). The CF-based polymer P is removed by vaporization caused by the above chemical decomposition reaction.

$$C_x F_y + O \rightarrow CO_2 + F_2 \qquad \text{Eq. (2)}$$

At this time, $CO_2$ and F generated by the chemical reaction of the above chemical reaction Eq. (2) are readily removed by the flow of the gas containing $O_2$ which has been formed near the surface of the CF-based polymer P. Therefore, the surface of the remaining CF-based polymer is constantly exposed to ultraviolet and $O_2$. As a result, the reaction of the chemical reaction Eq. (2) progresses more rapidly, and the removal rate of the CF-based polymer P increases.

In the above example, there has been described the chemical decomposition reaction for removing the deposit, e.g., the CF-based polymer adhered to the end portion of the wafer by the etching process of FIG. 3. However, a part of the CF-based film Q adhered to the end portion of the wafer by the film forming process of FIG. 4 can be also removed by the same chemical decomposition reaction, because C atoms and F atoms are basically contained in the CF-based film Q.

As set forth above, in the cleaning chamber 200 in accordance with this embodiment, the cleaning process for removing the deposits (e.g., the CF-based polymer) adhered to the end portion of the wafer is carried out by the chemical reaction caused by the flow of the gas containing $O_2$ which has been formed by simultaneously conducting the heating of the end portion of the wafer and the ultra violet application. Therefore, the deposits adhered to the end portion of the wafer can be removed without polishing the end portion of the wafer and without generating a plasma. That is, the end portion of the wafer is not polished in the cleaning process in accordance with this embodiment, so that it is possible to reduce efforts of removing dust generated by polishing and also possible to avoid contamination caused by the dust. Besides, no plasma is generated, so that a film (e.g., a low-k film) formed on the wafer W is not damaged. For these reasons, the cleaning process in accordance with this embodiment is optimal for cleaning the end portion of the wafer W having thereon the low-k film or the like.

(Configuration Example of Cleaning Chamber)

Hereinafter, a configuration example of the cleaning chamber 200 capable of executing the above cleaning process will be explained with reference to the drawings. As illustrated in FIG. 1, the cleaning chamber 200 is provided with a vessel 202, and the vessel 202 has therein a mounting table 204 for mounting thereon a wafer W and a cleaning mechanism 206 for cleaning an end portion (e.g., a rear side of a beveled portion) of the wafer W.

Figure 5:
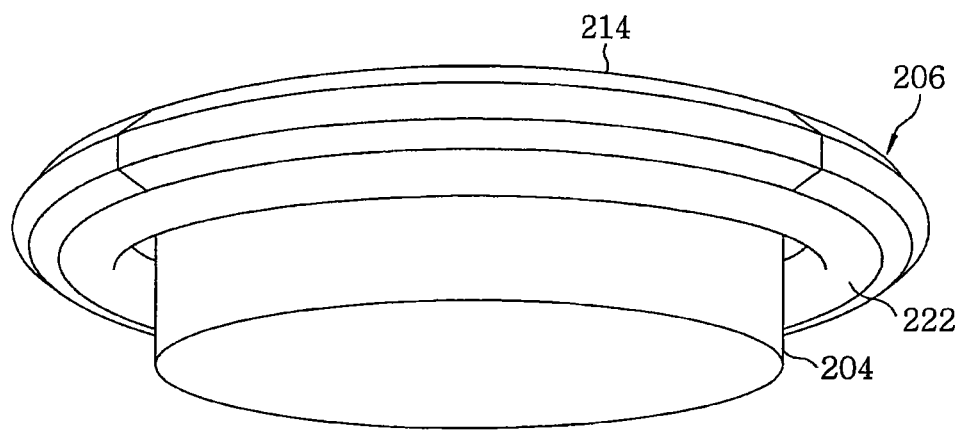
FIG. 5 offers a perspective view of an exterior configuration example of a cleaning chamber in accordance with the first embodiment of the present invention.
Figure 6:
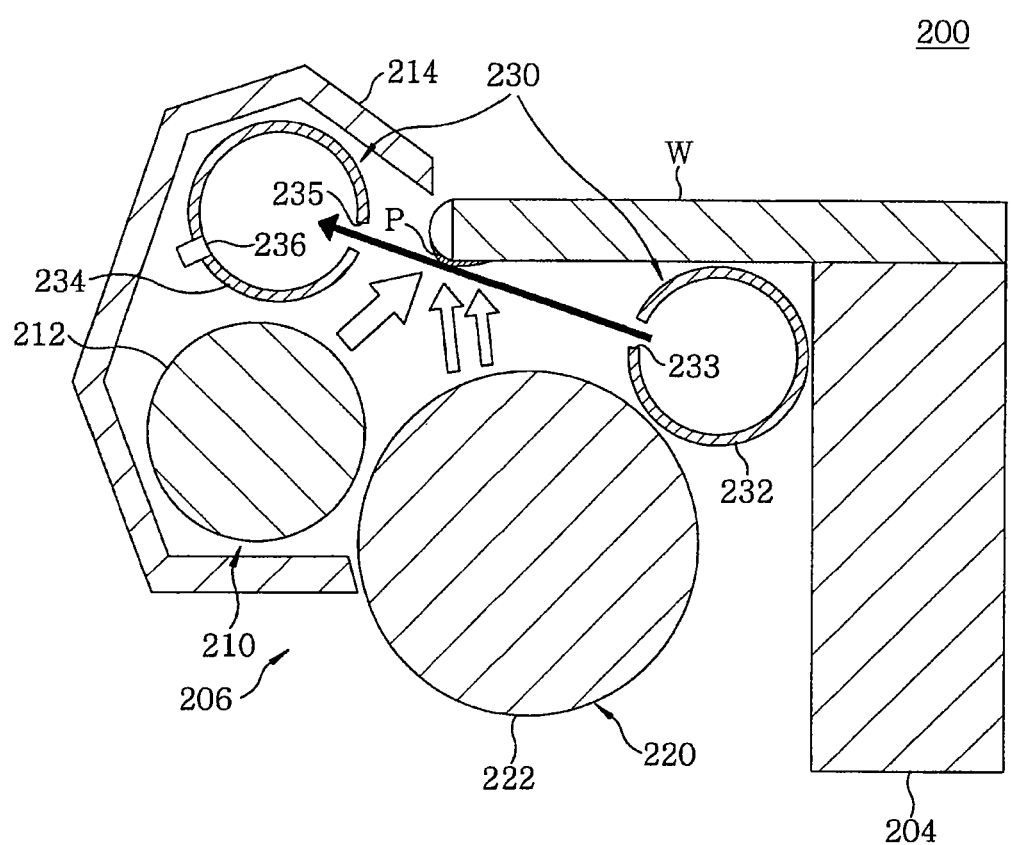
FIG. 6 represents a partial cross sectional view of the cleaning chamber in accordance with the first embodiment of the present invention.

The cleaning mechanism 206 is configured as shown in, e.g., FIGS. 5 and 6. FIG. 5 schematically illustrates an exterior of the cleaning mechanism 206 which is obliquely seen from the bottom side, and FIG. 6 offers a vertical cross sectional view near the end portion of the wafer W in the cleaning mechanism 206. As can be seen from FIGS. 1 and 5, the cleaning mechanism 206 is formed in an annular shape, and is disposed to surround an entire periphery of the end portion of the wafer W mounted on the mounting table 204. Accordingly, the entire periphery of the end portion of the wafer can be cleaned at a time, thereby reducing the cleaning time.

To be specific, as depicted in FIG. 6, the cleaning mechanism 206 has a heating unit 210 for heating the end portion of the wafer W, an ultraviolet application unit 220 for applying ultraviolet to the end portion of the wafer W, and a gas flow forming unit 230 for forming a gas flow on a surface of the end portion of the wafer W (e.g., a surface of a beveled portion) by discharging a gas (e.g., $O_2$ gas) toward the end portion of the wafer W.

(Configuration Example of Heating Unit)

The heating unit 210 has a heating lamp 212 for heating the end portion of the wafer W by applying light toward the end portion of the wafer W. The heating lamp 212 is disposed in an annular shape around the entire periphery of the wafer W near the end portion thereof. As shown in, e.g., FIG. 6, the heating lamp 212 is arranged at a position located outside of the end portion of the wafer W and slightly below the wafer W. With this arrangement, the end portion of the wafer W (e.g., the rear side of the beveled portion) can be heated by light directly applied thereto. By heating the end portion of the wafer W, the deposits P (e.g., CF-based polymer) adhered to the end portion of the wafer W are also heated.

Further, the heating lamp 212 may be configured as a single heating lamp formed in an annular shape, or may include a plurality of heating lamps arranged in an annular shape. Accordingly, the entire area of the end portion of the wafer W can be heated by applying light thereto at a time, thus reducing the heating time. The heating lamp 212 is formed as, e.g., a far infrared lamp such as a halogen lamp or the like, or as an infrared lamp (IR lamp). Moreover, since the light is applied toward the end portion of the wafer W, only the end portion of the wafer W can be locally heated by the heating unit 210. In view of this, as for the heating unit, it is preferable to use the halogen lamp capable of efficiently performing the local heating by using radiant heat of far infrared rays.

The heating unit 210 has an annular covering member 214 that covers the heating lamp 212 and opens at the wafer W side. The covering member 214 shown in FIG. 6 is a specific example of a structure for covering an upper portion, a lower portion, an outer lateral portion of the heating lamp 212. Preferably, the covering member 214 is preferable to be made of a material, e.g., stainless steel or the like, that can have light of the heating lamp 212 to be reflected on an inner surface thereof. In that case, it is preferable that the covering member 214 is constructed so that a part of the light of the heating lamp 212 which has been reflected on the inner surface of the covering member 214 is concentrated to the end portion (e.g., the beveled portion) of the wafer W.

Due to the presence of the covering member 214, the light of the heating lamp 212 is directly applied to the end portion of the wafer W and, also, the illumination of the light can be concentrated to the end portion of the wafer W by the reflection on the inner surface of the covering member 214. Accordingly, the end portion of the wafer W can be locally heated efficiently. Further, the covering member 214 can prevent the light of the heating lamp 212 from being applied on the surface of the wafer W, thereby avoiding damage to the film formed on the surface of the wafer W or the like.

The heating temperature is set to a temperature level at which at least the chemical decomposition reaction (e.g., the chemical reaction Eq. (2)) for removing deposits (e.g., CF-based polymer) can be carried out. For example, the heating temperature is preferably set to about 250° C. or less. Generally, in order to have the chemical decomposition reaction to proceed through the chemical reaction Eq. (2), it is preferable that the temperature is higher than or equal to about 280° C. Meanwhile, in the first embodiment, the chemical decomposition reaction through the chemical reaction Eq. (2) can sufficiently proceed even at a temperature of about 250° C. or less by the UV application. Therefore, the chemical decomposition reaction occurs at, e.g., about 25° C. (room temperature). However, it is preferable that the heating temperature is higher than the room temperature. This is because as the heating temperature increases, the reaction progresses rapidly and, hence, the deposits can be rapidly removed from the end portion of the wafer.

Moreover, a film formed on the wafer W may have low heat resistance depending on a material thereof. Therefore, in view of preventing film deterioration, it is preferable to set the heating temperature to a low level. For example, the film formed on the wafer W may be, e.g., a low-k film having high heat resistance at about 400° C., or a resist film having low heat resistance at about 150° C. Thus, in order to prevent the film deterioration, the heating temperature is preferably set to about 150° C. or less, or about 100° C. or less.

In addition, the heating temperature can be set based on a characteristic (heat resistance) of a film formed on the wafer. In case of a wafer W having thereon a film of low heat resistance (e.g., a resist film), the heating temperature is set to, e.g., about 150° C. about 100° C. or less). On the contrary, in case of a wafer W having thereon a film of high heat resistance (e.g., a low-k film), the heating temperature is set to, e.g., about 200° C. to about 250° C. Therefore, the film deterioration can be prevented regardless of the characteristic of the film formed on the wafer W, and the time required for the cleaning process can be reduced.

Figure 7:
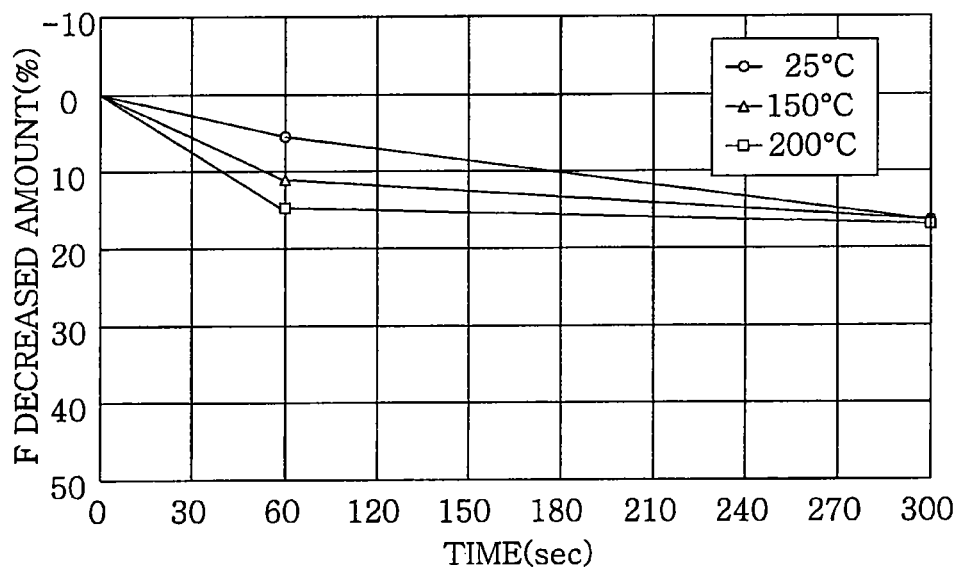
FIG. 7 is a graph showing a decreased amount of F in case of applying ultraviolet for a specific period of time to the CF-based polymer adhered to the wafer while varying a wafer temperature.

Hereinafter, a result of a test in which ultraviolet was applied to CF-based polymer adhered to a wafer W for a predetermined period of time while setting a wafer temperature to about 25° C., about 150° C. and about 200° C. will be described with reference to the drawings. In this test, the decreased amounts of F and C in the CF-based polymer adhered to the wafer W were measured while applying ultraviolet for 300 seconds. FIG. 7 is a graph showing the decreased amount of F in the CF-based polymer, and FIG. 8 is a graph depicting the decreased amount of C in the CF-based polymer.

The CF-based polymer was adhered to the wafer W by the plasma etching process performed on a silicon oxide film while using a CF-based gas (e.g., $C_5F_8$ gas). A film thickness of the CF-based polymer was about 9 nm. Before the UV application, the amount of C was substantially 20% of the total amount of the CF-based polymer, and the amount of F was substantially 60% of the total amount of the CF-based polymer. In FIGS. 7 and 8, the decreased amounts of F and C are indicated as percentage compared with the amounts of F and C measured before the UV application.

Referring to the test result shown in FIG. 7, on the assumption that the decreased amount of F was 0% before the ultra violet application, when the wafer temperature was about 25° C., the amount of F decreased gradually for 300 seconds. Specifically, it decreased by about 6% when 60 seconds elapsed and by about 15% when 300 seconds elapsed. Meanwhile, when the wafer temperature was about 150° C., the amount of F decreased by about 12% when 60 seconds elapsed and by about 15% when 300 seconds elapsed. Further, when the wafer temperature was about 200° C., the amount of F decreased by about 15% when 60 seconds elapsed, and became substantially constant thereafter. From the result, it has been found that the amount of F decreases faster in a higher wafer temperature.

Figure 8:
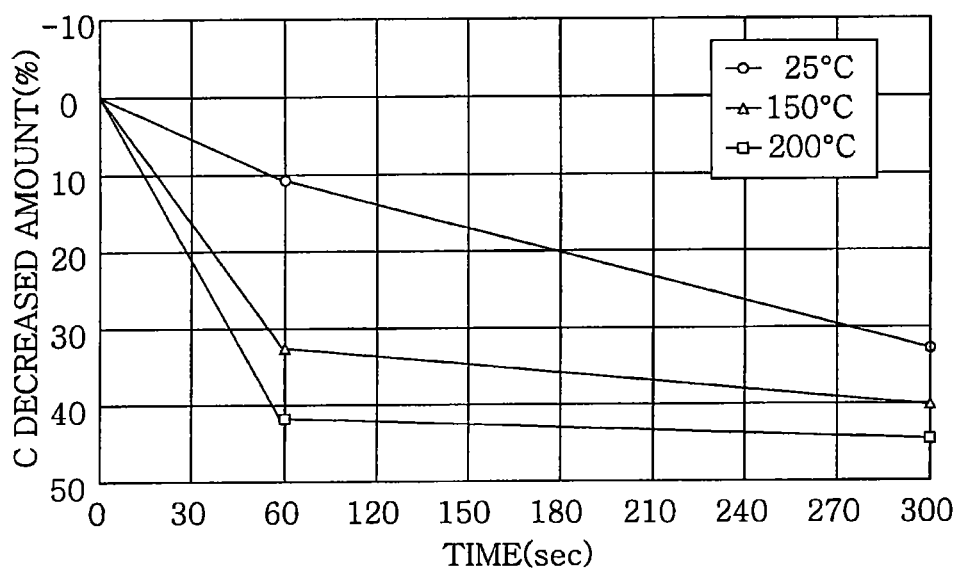
FIG. 8 illustrates a graph showing a decreased amount of C in case of applying ultraviolet for a specific period of time to the CF-based polymer adhered to the wafer while varying a wafer temperature.

Referring to the test result shown in FIG. 8, on the assumption that the decreased amount of C was 0% before the UV application, when the wafer temperature was about 25° C., the amount of C decreased gradually for 300 seconds. Specifically, it decreased by about 10% when 60 seconds elapsed and by about 32% when 300 seconds elapsed. Meanwhile, when the wafer temperature was about 150° C., the amount of C decreased by about 32% when 60 seconds elapsed and by about 40% when 300 seconds elapsed. Further, when the wafer temperature was about 200° C., the amount of C decreased by about 40% or more when 60 seconds elapsed, and became substantially constant thereafter. From the result, it has been found that the amount of C decreases faster in a higher wafer temperature. Especially in case of the amount of C, when the wafer temperature was about 25° C., the amount of C decreased by about 32% when 300 seconds elapsed. When the wafer temperature was about 150° C., the amount of C decreased by about 32% when 60 seconds elapsed. When the wafer temperature was about 200° C., the amount of C decreased by about 40% or more, surpassing the 32%, only when 60 seconds elapsed. In other words, it was clear that the amount of C decreases efficiently when the wafer temperature is between about 150° C. and about 200° C.

(Configuration Example of Ultraviolet Application Unit)

The ultraviolet application unit 220 includes, e.g., an ultraviolet lamp (UV lamp) 222. The UV lamp 222 is provided at a portion where ultraviolet can be applied to the rear side of the beveled portion of the wafer W. In the configuration example of FIG. 6, the UV lamp 222 is arranged directly below the beveled portion of the wafer W so as to be spaced therefrom at a predetermined distance (e.g., a few mm). When the ultraviolet is applied toward the end portion (e.g., the beveled portion) of the wafer by the UV lamp 222, the deposits (e.g., the CF-based polymer) adhered to the end portion of the wafer W are chemically decomposed and, thus, the deposits can be removed. The UV lamp 222 may be a single annular UV lamp, or may include a plurality of UV lamps arranged in an annular shape. Accordingly, light can be applied at a time to the entire periphery of the end portion of the wafer W, thereby reducing the time required to remove the deposits.

As for the UV lamp 222, there can be employed various lamps such as a Xenon (Xe) excimer lamp (wavelength of about 172 nm), a low-pressure mercury lamp (wavelength of about 185 nm or about 254 nm) or the like. For example, in the atmospheric environment, ultraviolet of a shorter wavelength has a higher absorptivity to deposits, but also has a higher ozone production rate. Therefore, the UV lamp 222 that applies ultraviolet of a shorter wavelength is positioned closer to the deposits.

In the atmospheric environment, the UV lamp 222 can be disposed to be spaced from the end portion of the wafer W at a greater distance in case of using a low-pressure mercury lamp of a comparatively long wavelength than in case of using a Xe excimer lamp of a comparatively short wavelength. Meanwhile, in the vacuum pressure environment, the UV lamp 222 for applying ultraviolet of a short wavelength can also be disposed to be spaced from the wafer W at a distance. If the UV lamp 222 can be arranged to be spaced from the end portion of the wafer W at a distance, a degree of freedom of installing the respective units of the cleaning mechanism 206 can be increased.

For instance, when the cleaning chamber 200 is in the atmospheric environment, a lamp for applying ultraviolet of a comparatively long wavelength (e.g., a low-pressure mercury lamp) is preferably used as the UV lamp 222. On the contrary, when the cleaning chamber 222 is in the vacuum pressure environment, a lamp for applying ultraviolet of a comparatively short wavelength (e.g., a Xe excimer lamp) is preferably used as the UV lamp 222. As described above, the UV lamp 222 that applies ultraviolet of an appropriate wavelength is selected depending on the pressure in the cleaning chamber 200, so that the degree of freedom of installing the respective units of the cleaning mechanism 206 can be increased.

(Configuration Example of Gas Flow Forming Unit)

The gas flow forming unit 230 has a discharge pipe 232 and a suction pipe 234, both being formed as annular pipes. The discharge pipe 232 discharges a gas toward the end portion of the wafer W and, then, the suction pipe 234 sucks in the discharged gas, thereby forming a gas flow on the surface of the end portion (e.g., the rear side of the beveled portion) of the wafer W.

The discharge pipe 232 is provided at an inner side of the end portion of the wafer W so as to be disposed in an annular shape around the entire periphery of the end portion of the wafer W, while the suction pipe 234 is provided at an outer side of the end portion of the wafer W so as to be arranged in an annular shape around the entire periphery of the end portion of the wafer W. As shown in FIG. 6, for example, the discharge pipe 232 is arranged below the wafer W to surround the entire periphery of the mounting table 204, and the suction pipe 234 is provided inside the covering member 214 to surround the entire periphery of the end portion of the wafer W.

By positioning the suction pipe 234 as near as possible to the discharge pipe 232, the gas flow can be formed on a desired portion (e.g., the rear side of the beveled portion of the wafer W) and, hence, the efficiency of removing the deposits adhered to the end portion of the wafer W can be improved. Further, the suction pipe 234 may not be necessarily provided inside the covering member 214. The suction pipe 234 can be provided anywhere near the end portion of the wafer W, as long as the gas flow can be formed on the surface of the end portion of the wafer between the suction pipe 234 and the discharge pipe 232.

The discharge pipe 232 has a discharge opening 233 for discharging a gas (e.g., $O_2$ gas) toward the surface of the end portion of the wafer W. The discharge opening 233 is provided around the entire periphery of the discharge pipe 232. Moreover, the discharge opening 233 may be formed as a single slit provided around the entire periphery of the discharge pipe 232, or may include a plurality of openings formed around the entire periphery of the discharge pipe 232.

The suction pipe 234 has, at a portion substantially facing the discharge pipe 232, a suction opening 235 for sucking in a gas. The suction pipe 234 is connected to, e.g., a pump (e.g., a gas exhaust pump) (not shown). The suction opening 235 is provided around the entire periphery of the suction pipe 234. Moreover, the suction opening 235 may be formed as a single slit provided around the entire periphery of the suction pipe 234, or may include a plurality of openings formed around the entire periphery of the suction pipe 234.

In the gas flow forming unit 230, a gas (e.g., $O_2$ gas) can be discharged toward the entire periphery of the end portion of the wafer W at a time, and then the discharged gas can be sucked in at a time. Accordingly, the gas flow can be formed toward an outer side of a radial direction of the wafer W in the entire periphery of the end portion of the wafer W, thereby increasing the removal rate of the deposits (CF-based polymer) P.

A gas to be discharged by the discharge pipe 232 is preferable to be a gas capable of generating active oxygen O for decomposing the deposits, e.g., the CF-based polymer P, adhered to the wafer W, that is, a gas containing at least oxygen atoms. As for such a gas, an $O_2$ gas is preferable. However, the concentration of $O_2$ may not be necessarily 100%. As will be explained in a test to be described later, it is preferable that an $O_2$ gas concentration is extremely low, e.g., about 1% to about 3%. In that case, there can be used a gaseous mixture of an inactive gas (e.g., $N_2$ gas) and $O_2$ gas whose concentration is set to be in a range from about 1% to about 3% by adjusting a mixing ratio therebetween. Instead of the $O_2$ gas, dry air can be used because air (the atmosphere) contains $O_2$ of a specific concentration (e.g., about 21%). Besides, ozone gas $O_3$ can be also used instead of $O_2$ gas, because $O_3$ generates active oxygen O by ultraviolet as described in the chemical reaction Eqs. (1).

Figure 9:
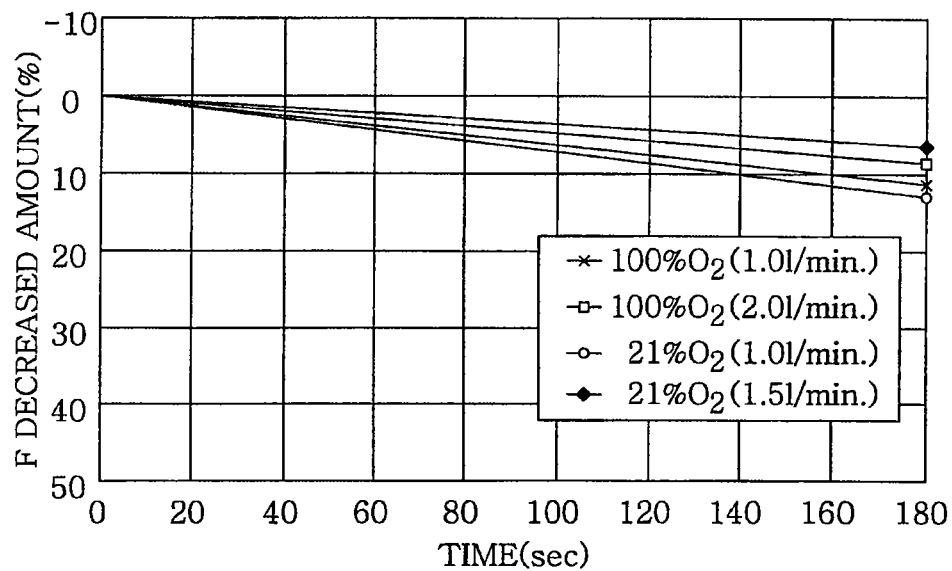
FIG. 9 depicts a graph illustrating a decreased amount of F in case of applying ultraviolet for a specific period of time to the CF-based polymer adhered to the wafer while varying an $O_2$ concentration of a gas.

Hereinafter, a result of a test performed while varying an $O_2$ concentration of a gas and a flow rate thereof will be described with reference to the drawings. In this test, in a state where ultraviolet was applied for 180 seconds, a gas flow was formed by using an $O_2$ gas having an $O_2$ concentration of 100% and, also, a gas flow was formed by using a gas having an $O_2$ gas concentration of about 21%. Then, the decreased amounts of F and C in the CF-based polymer adhered to the wafer were measured in both cases. FIG. 9 depicts a graph illustrating the decreased amount of F in the CF-based polymer, and FIG. 10 shows a graph depicting the decreased amount of C in the CF-based polymer.

In this test, a flow rate of the gas having $O_2$ concentration of 100% was set to 1 λ/min and 2.0 λ/min, and the decreased amounts of F and C were measured in both cases. Meanwhile, a flow rate of the gas having $O_2$ concentration of about 21% was set to 1 λ/min and 1.5λ/min, and the decreased amounts of F and C were measured in both cases. When the flow rate was 1.0 λ/min, a gas flow was formed by using dry air. When the flow rate was 1.5 λ/min, a gas flow was formed only by suction. A wafer used in this test was the same as that used in the test described in FIGS. 7 and 8. A wafer temperature was about 25° C. (room temperature).

Figure 10:
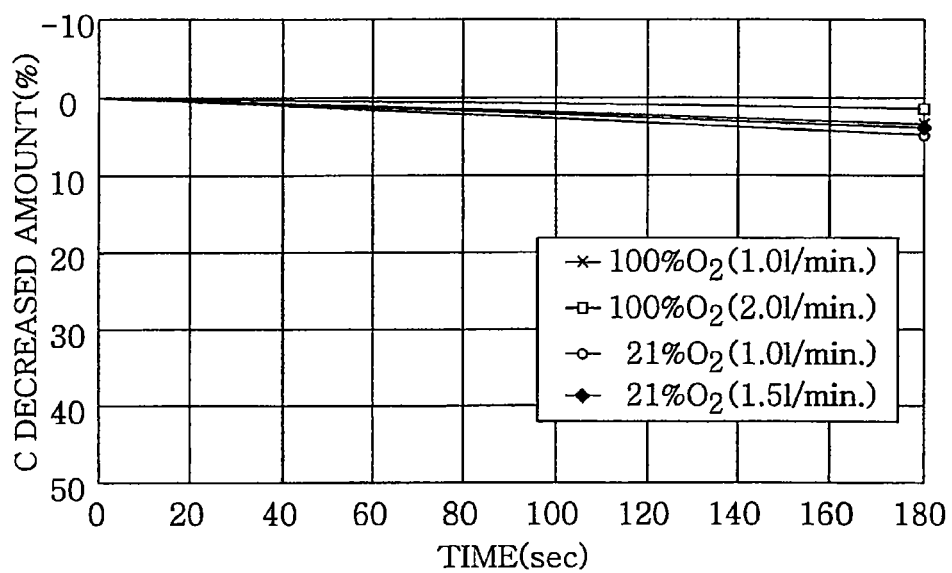
FIG. 10 shows a graph illustrating a decreased amount of C in case of applying ultraviolet for a specific period of time to the CF-based polymer adhered to the wafer while varying an $O_2$ concentration of a gas.

According to the test result shown in FIGS. 9 and 10, the amounts of F and C decreased similarly in both cases where the $O_2$ concentration was 100% and about 21%. Therefore, the $O_2$ concentration may not be necessarily 100%, and it has been found that if a gas flow is formed even at a low concentration, e.g., about 21%, the CF-based polymer can be removed. Further, it has also been found that if a gas flow is formed even at a low concentration, the CF-based polymer can be removed only by sucking in a gas.

Figure 11:
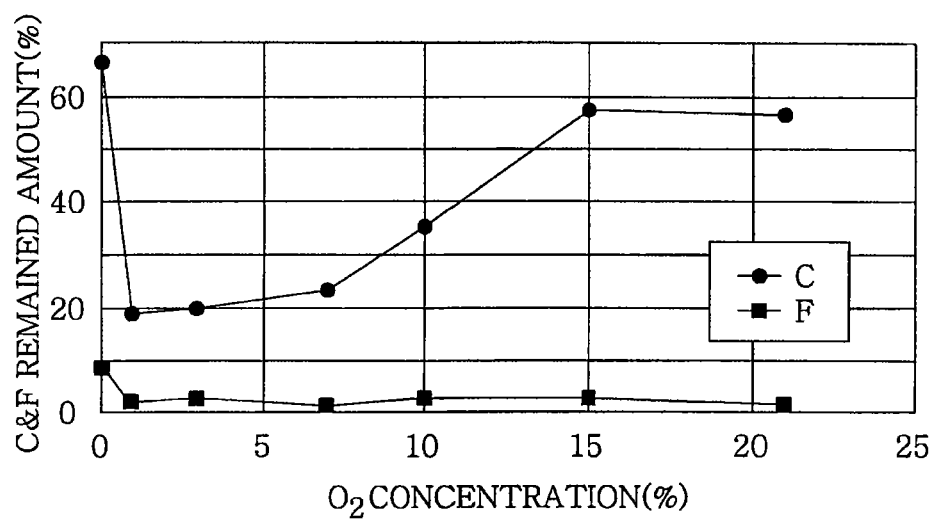
FIG. 11 is a graph showing decreased amounts of C and F in case of applying ultraviolet for a specific period of time to a CF-based film formed on the wafer while varying an $O_2$ concentration of a gas within a range below 21%.

FIG. 11 shows a result of a test performed while setting an $O_2$ concentration of a gas under about 21%. In this test, there was prepared a sample wafer having a CF-based film formed on a silicon oxide film. Next, in a state where ultraviolet was applied to the CF-based film of the sample wafer for 60 seconds, a process for forming a gas flow on a surface of the CF-based film was performed by using a gaseous mixture of $N_2$ and $O_2$ while varying an $O_2$ concentration and, then, the decreased amount of the processed CF-based film in the sample wafer was measured. FIG. 11 depicts a relationship between the decreased amount of the CF-based film and the $O_2$ concentration in case of performing the process while varying the mixing ratio of $N_2$ and $O_2$. At this time, the $O_2$ concentration was varied to 0% (non-existence of $O_2$), 1%, 3%, 7%, 10%, 15% and 21%.

In this test, in order to measure the decreased amount of the CF-based film, a surface of a processed sample wafer was analyzed. To be specific, electromagnetic beam was applied to the surface at an angle of, e.g., about 5°. Thereafter, based on an electromagnetic spectrum emitted therefrom, there was measured a ratio of C and F of a CF-based film with respect to total atoms (Si and O of an underlying layer and C and F of the CF-based film) contained in a region extending from the surface to a predetermined depth. Referring to the graph of FIG. 11, as the ratio of C and F with respect to the total atoms decreased, the amounts of C and F decreased and, hence, the CF-based film decreased.

According to the test result described in FIG. 11, when the $O_2$ concentration was set to about 21% or less, the decreased amounts of C and F hardly changed after the $O_2$ concentration exceeded about 15%. The amounts of C and F decreased by a large amount when the $O_2$ concentration was about 15% or less. Especially, the amounts of C and F decreased by the largest amounts when the $O_2$ concentration was about 1% to about 3%. That is, it has been found that the CF-based polymer can be efficiently removed when the gas flow is formed at the $O_2$ concentration of about 1% to about 3% much smaller than about 21%.

Meanwhile, $CO_2$ and $F_2$ as reaction products generated by the chemical decomposition reaction (the chemical reaction Eq. (2)) are sucked into the suction pipe 234. While the chemical decomposition reaction (the chemical reaction Eq. (2)) of the CF-based polymer adhered to the wafer W is being carried out, a concentration of $CO_2$ sucked into the suction pipe 234 increases. However, when the CF-based polymer P is removed by the progress of the chemical decomposition reaction, $CO_2$ is no longer generated and, hence, the concentration of $CO_2$ sucked into the suction pipe 234 decreases abruptly. Therefore, if the concentration of the reaction product gas ($CO_2$) is detected by a concentration sensor, an end point of the cleaning process for the wafer end portion can be detected based on the concentration variation.

To be specific, the suction pipe 234 is provided with a concentration sensor 236 as an example of a reaction product gas concentration sensor for detecting a $CO_2$ concentration. When the cleaning process of the wafer end portion starts, the $CO_2$ concentration is detected by the concentration sensor 236. To be more specific, the concentration sensor 236 is connected to the control unit 300, and the $CO_2$ concentration is monitored by the control unit 300. Moreover, a point at which the $CO_2$ concentration becomes smaller than or equal to a predetermined threshold value is determined as an end point, and the cleaning process is completed at the end point. Since the end point of the cleaning process of the wafer end portion can be detected with high precision, the efficiency of the cleaning process is improved and, also, the deposits can be removed in a shorter period of time.

(Specific Example of Cleaning Process)

Figure 12:
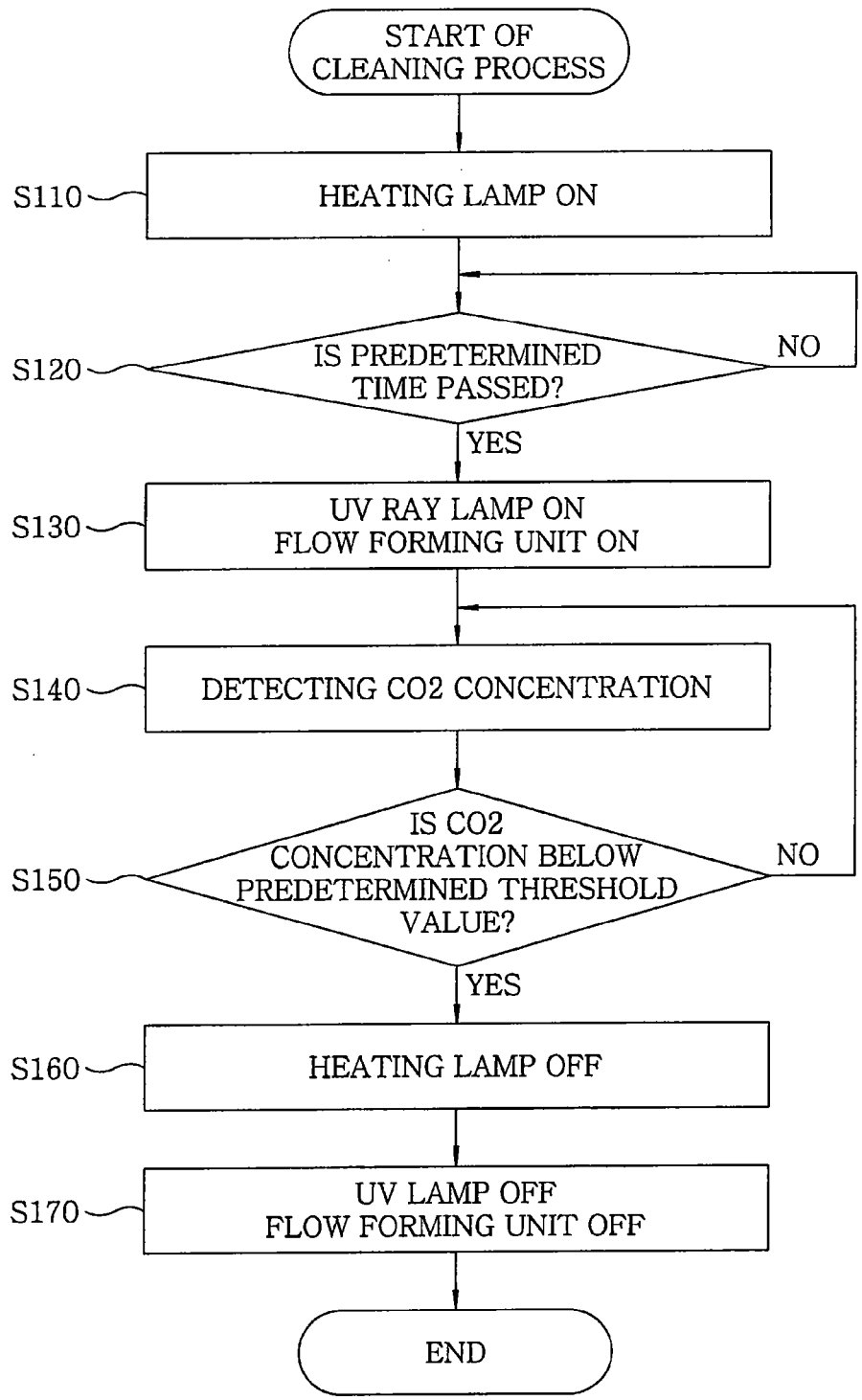
FIG. 12 provides a flowchart of a specific example of a cleaning process in accordance with the first embodiment of the present invention.

Hereinafter, a specific example of the cleaning process for the wafer end portion which is performed in the cleaning chamber 200 will be described with reference to the drawings. The cleaning process is performed by the control unit 300 of the substrate processing apparatus 100 controlling the respective units of the cleaning chamber 200. FIG. 12 offers a flowchart of the specific example of the cleaning process in accordance with the first embodiment.

First of all, when a wafer W is transferred to the cleaning chamber 200, the heating lamp 212 is ON in step S110, to thereby start heating of an end portion of the wafer W. Next, a predetermined period of time (e.g., a few seconds) elapses in step S120. Because of the prepared time lock, a temperature of the wafer end portion increases to a certain level before UV application, thus improving the efficiency of the chemical decomposition reaction for removing deposits. Preferably, the predetermined period of time is determined depending on a set temperature of the wafer end portion. For example, the predetermined period of time may increase as the set temperature increases.

Thereafter, in step S130, the UV lamp 222 is ON to apply ultraviolet to the wafer end portion and, also, the gas flow forming unit 230 is ON to form a flow of a gas (e.g., $O_2$ gas) on a surface of the wafer end portion. Specifically, $O_2$ gas is supplied to the discharge pipe 232, and the pump of the suction pipe 234 is driven to start the suction.

Next, in step S140, the $CO_2$ concentration is measured by the concentration sensor 236. In step S150, it is determined whether or not the $CO_2$ concentration is smaller than or equal to a predetermined threshold value. If it is determined that the $CO_2$ concentration is greater than the predetermined threshold value, the process returns to step 140. On the contrary, if it is determined that the $CO_2$ concentration is smaller than or equal to the predetermined threshold value, the heating lamp 212 is OFF in step S160.

Then, in step S170, the UV lamp 222 and the gas flow forming unit 230 are OFF, thereby completing the cleaning process. In the above cleaning process, the entire periphery of the wafer end portion is heated at a time by the heating lamp 212, and an active oxygen O is generated by ultraviolet applied to the entire periphery of the wafer end portion by the UV lamp 222. The active oxygen O causes the chemical decomposition reaction of the chemical reaction Eqs. (1), so that the deposits (CF-based polymer) adhered to the entire periphery of the wafer end portion are removed at a time.

As set forth above, in the cleaning chamber 200 in accordance with the first embodiment, the deposits (CF-based polymer) adhered to the entire periphery of the wafer end portion can be removed at a time. As a result, the wafer end portion can be cleaned at high speed in a very short period of time.

(Configuration Example of Cleaning Chamber in Accordance with a Second Embodiment)

Figure 13:
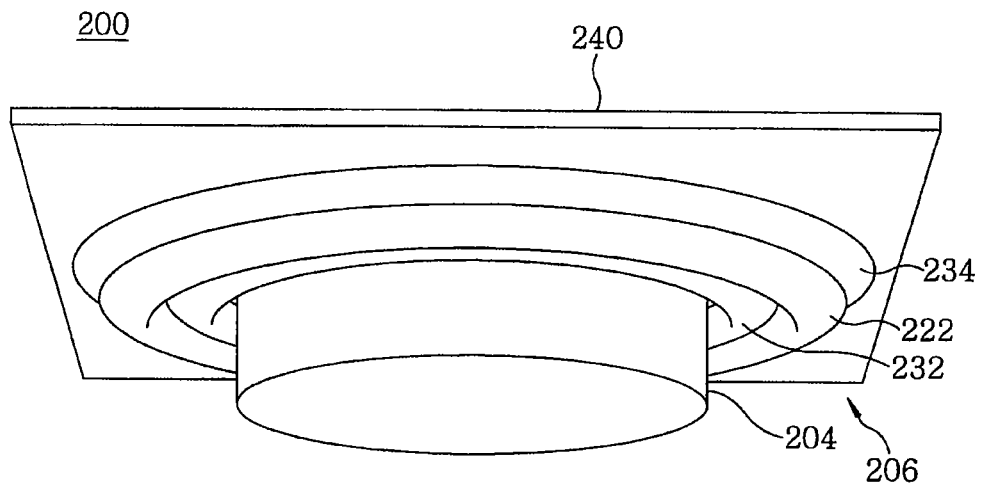
FIG. 13 sets forth an exterior configuration example of a cleaning chamber in accordance with a second embodiment of the present invention.
Figure 14:
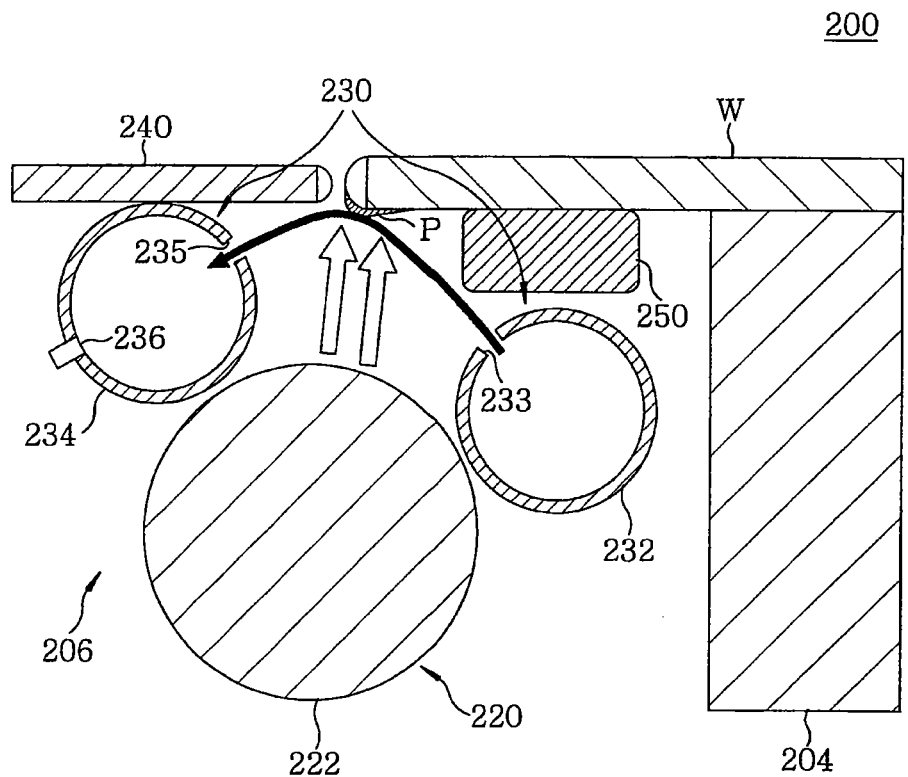
FIG. 14 offers a partial cross sectional view of the cleaning chamber in accordance with the second embodiment of the present invention.

Hereinafter, a cleaning chamber in accordance with a second embodiment of the present invention will be described with reference to the drawings. FIG. 13 schematically shows an exterior of a cleaning mechanism 206 of the cleaning chamber in accordance with the second embodiment, which is obliquely seen from the bottom side. FIG. 14 provides a cross sectional view describing a vicinity of the end portion of the wafer W in the cleaning mechanism 206. As shown in FIGS. 13 and 14, the cleaning mechanism 206 is arranged to surround the periphery of the end portion of the wafer W mounted on the mounting table 204. As a consequence, the entire periphery of the end portion of the wafer W can be cleaned at a time, thereby reducing the cleaning time.

In the cleaning mechanism 206 illustrated in FIG. 14, instead of using the heating lamp 212 as the heating unit, an annular heater 250 provided on a rear side of the end portion of the wafer W is used to heat the end portion of the wafer W. As for the heater 250, there is used, e.g., an induction heating heater. Accordingly, the end portion of the wafer W can be concentratedly heated.

In that case, a shielding plate 240 is disposed to surround the periphery of the wafer W. The shielding plate 240 blocks ultraviolet from the ultraviolet application unit 220, so that the ultraviolet can be prevented from reaching the surface of the wafer W. Further, the gas flow formed by the gas flow forming unit 230 can be prevented from flowing from the surface of the end portion of the wafer W to the top surface of the wafer W. As a result, the top surface of the wafer W can be prevented from being damaged by $O_3$ or the like contained in the gas.

The configuration of the ultraviolet application unit 220 is the same as that shown in FIG. 6. The configuration of the gas flow forming unit 230 is substantially the same as that shown in FIG. 6. Meanwhile, the discharge pipe 232 shown in FIG. 14 is arranged under the heater 250, and the discharge opening 233 is disposed to discharge a gas toward the end portion of the wafer W (e.g., a rear side of a beveled portion). Moreover, the suction pipe 234 is provided under the shielding plate 240, and the suction opening 235 is disposed so that a gas flow is formed on the surface of the wafer end portion (e.g. the rear side of the beveled portion).

The same cleaning process described in FIG. 12 can also be performed in the cleaning chamber 200 in accordance with the second embodiment. In this case, instead of the heating lamp 212, the heater 250 is ON in step S110. In step S160, instead of the heating lamp 212, the heater 250 is OFF. In this cleaning process, the entire periphery of the wafer end portion is heated at a time by the heater 250, and an active oxygen O is generated by ultraviolet applied to the entire periphery of the wafer end portion by the UV lamp 222. The active oxygen O causes the chemical decomposition reaction of the chemical reaction Eqs. (1), so that the deposits (CF-based polymer) adhered to the entire periphery of the wafer end portion are removed at a time.

In the cleaning chamber 200 in accordance with the second embodiment, as in the case of the first embodiment, the deposits (CF-based polymer) adhered to the entire periphery of the wafer end portion can be removed at a time. As a result, the wafer end portion can be cleaned at high speed in a very short period of time.

In the above first and second embodiments, the cleaning chamber 200 is connected to the transfer chamber 130 of the substrate processing apparatus 100, and the cleaning process of the wafer end portion is performed in the atmospheric environment. However, the present invention is not limited the above embodiments. For example, any one of the processing chambers 140A to 140F can be used as the cleaning chamber 200, and the cleaning process of the wafer end portion can be carried out in the atmospheric environment. When the cleaning chamber 200 is connected to the transfer chamber 130 of the substrate processing apparatus 100, the cleaning process of the wafer end portion is performed in the atmospheric environment and, hence, an ultraviolet source of a long wavelength, e.g., a low-pressure mercury lamp, is preferably used as the ultraviolet application unit 220. Meanwhile, when any one of the processing chambers 140A to 140F is used as the cleaning chamber 200, the cleaning process of the wafer end portion is performed in the vacuum pressure environment and, hence, an ultraviolet source of a short wavelength, e.g., a Xe excimer lamp, is preferably used as the ultraviolet application unit 220.

While the preferred embodiments of the present invention have been described with accompanying drawings, it is not limited thereto. It will be understood by those skilled in the art that various changes and modifications may be made within the category as defined in the following claims, and those are within the technical scope of the present invention.

INDUSTRIAL APPLICABILITY

The present invention can be applied to a substrate cleaning apparatus for cleaning an end portion of a substrate, e.g., a semiconductor wafer or a liquid crystal substrate, a substrate cleaning method and a substrate processing apparatus.

What is claimed is:

1. A substrate cleaning method of a substrate cleaning apparatus for removing fluorocarbon-based polymer adhered to an end portion of a substrate having a top surface and a bottom surface, the substrate cleaning apparatus including: a heating unit for heating the end portion of the substrate whose bottom surface is placed on a mounting table; an ultraviolet application unit for applying ultraviolet to the end portion of the substrate; and a gas flow forming unit, all units being disposed below the bottom surface of the substrate near the end portion so as to surround the substrate, wherein when the end portion of the substrate is cleaned by the substrate cleaning apparatus, the end portion of the substrate is heated by the heating unit and, then, the ultraviolet is applied to the end portion of the substrate by the ultraviolet application unit without generating a plasma while providing a gas flow by using a gaseous mixture of inactive gas and $O_2$ gas on the surface of the end portion of the substrate by the gas flow forming unit, wherein the gaseous mixture has an $O_2$ concentration of about 1% to about 3%, and wherein when applying the ultraviolet to the end portion of the substrate by the ultraviolet application unit, the ultraviolet from the ultraviolet application unit is blocked by a blocking member so that the ultraviolet is prevented from reaching a top surface of the substrate, the blocking member being disposed to surround the heating unit, the ultraviolet application unit, the gas flow forming unit, and a periphery of the substrate.

2. The substrate cleaning method of claim 1, wherein the gas flow forming unit includes: a discharge pipe provided at an inner side of the end portion of the substrate; and a suction pipe provided at an outer side of the end portion of the substrate, wherein when the gas flow is provided on the surface of the end portion of the substrate, the gas is discharged from the discharge pipe toward the end portion of the substrate, and then is sucked into the suction pipe.

3. The substrate cleaning method of claim 2, wherein the suction pipe has a concentration sensor for detecting a concentration of carbon dioxide generated by removing fluorocarbon-based polymer adhered to the end portion of the substrate, wherein the concentration of the carbon dioxide sucked into the suction pipe is detected by the concentration sensor during cleaning of the end portion of the substrate, and the cleaning of the end portion of the substrate is completed when the concentration of the carbon dioxide becomes smaller than or equal to a threshold value.

4. The substrate cleaning method of claim 1, wherein $O_2$ included in the gas is converted into active oxygen by the ultraviolet.

\* \* \* \* \*